(12) United States Patent
Word et al.

(10) Patent No.: US 7,926,002 B2
(45) Date of Patent: Apr. 12, 2011

(54) SELECTIVE OPTICAL PROXIMITY LAYOUT DESIGN DATA CORRECTION

(75) Inventors: James C. Word, Portland, OR (US); Dragos S. Dudau, Cupertino, CA (US); Nicolas B. Cobb, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 235 days.

(21) Appl. No.: 12/039,720

(22) Filed: Feb. 28, 2008

(65) Prior Publication Data

US 2008/0301611 A1 Dec. 4, 2008

Related U.S. Application Data

(60) Provisional application No. 60/904,341, filed on Feb. 28, 2007, provisional application No. 60/973,091, filed on Sep. 17, 2007.

(51) Int. Cl.
*G06F 17/50* (2006.01)

(52) U.S. Cl. ........................................... 716/50; 716/51

(58) Field of Classification Search .............. 716/19–21, 716/50–54
See application file for complete search history.

(56) References Cited

U.S. PATENT DOCUMENTS

| | | | |
|---|---|---|---|
| 6,684,382 B2 * | 1/2004 | Liu ................................. | 716/19 |
| 2002/0146628 A1 * | 10/2002 | Ota ................................. | 430/22 |
| 2005/0234684 A1 * | 10/2005 | Sawicki et al. ................... | 703/1 |

* cited by examiner

*Primary Examiner* — Jack Chiang
*Assistant Examiner* — Binh C Tat
(74) *Attorney, Agent, or Firm* — Banner & Witcoff, Ltd.

(57) ABSTRACT

After layout design data has been modified using an OPC process, a repair flow is initiated. This repair flow includes analyzing the modified data to identify any remaining or new potential print errors in the layout data. Regions then are formed around the identified potential print errors, and a subsequent OPC process is performed only on the data within these regions using a different set of process parameters from the process parameters employed by the initial OPC process. This repair flow is iteratively repeated, where a different set of process parameter values for the subsequent OPC process is used during each iteration.

20 Claims, 6 Drawing Sheets

FIG. 9a
OPC Shapes

FIG. 9b
Simulated Post OPC-Images

FIG. 10a
OPC Shapes

FIG. 10b
Simulated Post OPC-Images

Table 1

Table 2

SELECTIVE OPTICAL PROXIMITY LAYOUT DESIGN DATA CORRECTION

RELATED APPLICATIONS

This application claims priority to U.S. Provisional Patent Application No. 60/904,341 entitled "Optical Proximity Mask Shape Repair," filed on Feb. 28, 2007, and naming Nicolas Cobb, et. al. as inventors, and to U.S. Provisional Patent Application No. 60/973,091 entitled "Automatic OPC Repair Flow: Optimized Implementation of the Repair Recipe," filed on Sep. 17, 2007, and naming Mohamed Al-Imam, et. al. as inventors, which applications are incorporated entirely herein by reference.

FIELD OF THE INVENTION

The present invention relates to resolution enhancement technologies. Various implementations of the invention may be useful for selectively modifying layout design data used to create a mask.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit, its complexity, the design team, and the microcircuit fabricator or foundry that will manufacture the microcircuit. Typically, software and hardware "tools" verify the design at various stages of the design flow by running software simulators and/or hardware emulators, and errors in the design are corrected or the design is otherwise improved.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the desired functions. This analysis is sometimes referred to as "formal verification."

Once the relationships between circuit devices have been established, the design is again transformed, this time into a physical design that describes specific geometric elements. This type of design often is referred to as a "layout" design.

The geometric elements, which typically are polygons, define the shapes that will be created in various materials to manufacture the circuit. Typically, a designer will select groups of geometric elements representing circuit device components (e.g., contacts, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks. After the design is finalized, the design can be used by fabricated to manufacturer the device.

There are many different fabrication processes for manufacturing a circuit, but most processes include a series of steps which deposit layers of different materials on a substrate, expose specific portions of each layer to radiation, and etch the exposed (or non-exposed) portions of the layer away. For example, a simple semiconductor circuit could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, causing the exposed areas to be etched away, leaving behind exposed areas on the epitaxial layer, (i.e., areas no longer covered by the nitride layer). Specific shapes or patterns on these exposed areas then are subjected to a diffusion or ion implantation process. This causes dopants, (for example, phosphorus) to enter the exposed epitaxial layer and form negative wells. This process of depositing layers of material on the substrate or subsequent material layers, and then exposing specific patterns to radiation, dopants or other diffusion processes, is repeated a number of times. This series of steps allows the different physical layers of the circuit to be manufactured, forming gates, connecting layers, polysilicon layers, and eventually transistors on the substrate. The combination of these components make up what is often referred to as an integrated circuit device.

Each time that a layer is exposed to radiation or diffusion, a mask must be created to expose certain areas to the radiation or diffusion and protect the other areas from exposure. Each mask is created from circuit layout data. For each layer of material in the circuit that is masked and etched, corresponding layout design data must be used to create the mask. The geometric elements described in layout design data define the relative locations or areas of the circuit device that will be exposed to radiation or diffusion. A mask or reticle writing tool is used to create the mask or reticle based upon the layout design data, after which the mask can be used in a photolithographic process. This process of transferring the design from the mask to the substrate is often referred to as "printing" or "etching" the design.

As designers and manufacturers continue to increase the number of circuit components in a given area and/or shrink the size of circuit components, the shapes reproduced on the substrate (and thus the shapes in the mask) become smaller and closer together. This reduction in feature size increases the difficulty of faithfully reproducing the image intended by the layout design to the mask and onto the substrate. This difficulty often results in defects where the intended image is not accurately "printed" onto the substrate, creating flaws in the manufactured device. Accordingly, the terms "error" or "potential print error" are used herein to refer to a feature or group of features in layout design data that may not be accurately printed onto a substrate during a lithographic manufacturing process.

To address this problem, one or more resolution enhancement techniques are often employed. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, *Proceedings of SPIE* Vol. 5377, which article is incorporated entirely herein by reference. One of these techniques, radiation amplitude control, is often facilitated by modifying the layout design data employed to create the lithographic mask. One way to implement this technique, for example, is to adjust the edges of the geometric elements in the layout design so that the mask created from the modified layout data will control the radiation amplitude in a desired way during a lithographic process. The process of modifying the layout design data in this manner is often referred to as "optical proximity correction" or "optical process correction" (OPC).

As previously noted, a layout design is made up of a variety of geometric elements. In a conventional OPC process, the edges of the geometric elements (which are typically polygons) are fragmented, and the edge fragments are rearranged to reflect the desired modifications. For example, some OPC processes will reconfigure the edge fragments of a polygon to create serifs at one or more corners. The edge fragments are typically reconfigured according to one or more parameters, such as the size and spacing limitations on the edge fragments, or polygon placement. The values selected for these parameters have a significant impact on how and to what extent that the edge fragments within the layout data are modified during the OPC process. The set of parameter values used for an OPC process are often referred to as the "OPC recipe".

Once a layout design is finalized, it must be examined to ensure that the design does not have potential print errors (i.e., design features that may not be correctly printed during a lithograph process). If there are potential print errors, then these potential print errors must be corrected. For example, if the design includes only a few potential print errors, then a designer may manually correct these errors. Alternately, a designer may employ an OPC process on the design, to compensate for the limitations in the lithographic process. Again, the layout design must be examined to ensure that no potential print errors remain, and that the OPC process did not produce new potential print errors. If the design data does contain potential print errors, then the OPC process typically is repeated on the original layout design using a different set of process parameter values, in hopes that this different set of parameter values will correct the potential print errors.

While performing OPC on layout design data can improve the fidelity of the lithographic process, OPC can be expensive in terms of both computing resources and processing time. Layout designs can be very large, and even one layout data file for a single layer of a field programmable gate array may be approximately 58 gigabytes. Accordingly, performing even a single OPC process on a design is computationally intensive. Repeating an OPC process to correct remaining potential print errors then only adds to time required to finalize the layout design. On the other hand, manually correcting potential print errors is very time consuming as well.

BRIEF SUMMARY OF THE INVENTION

Aspects of the invention relate to techniques for more efficiently preparing layout data to be used in implementing a resolution enhancement process.

Various implementations of the invention repair potential print errors in layout design data without requiring that the user manually correct the potential print errors or that the OPC process be repeated for the entire layout design. According to some implementations of the invention, after layout design data has been modified using an OPC process, a repair flow is initiated. This repair flow includes analyzing the modified data to identify any remaining or new potential print errors in the layout data. Regions then are formed around the identified potential print errors, and a subsequent OPC process is performed only on the data within these regions. In further examples of the invention, this repair flow is iteratively repeated, where a different set of process parameter values for the subsequent OPC process are used during each iteration.

These and other features and aspects of the invention will be apparent upon consideration of the following detailed description.

BRIEF DESCRIPTION OF THE DRAWINGS

The present invention will be described by way of illustrative embodiments shown in the accompanying drawings in which like references denote similar elements, and in which.

Table 1 depicts the number of defects found at each stage of an exemplary implementation.

Table 2 depicts the edges processed at each state of an exemplary implementation.

DETAILED DESCRIPTION OF ILLUSTRATIVE EMBODIMENTS

Common Causes of Potential Print Errors

As discussed in detail above, OPC typically is performed on layout design data to improve the reproducibility of the design image during a lithographic manufacturing process. As also previously noted, even after an OPC process is performed, the layout design data may still include various potential print errors. One cause of such potential print errors is the non-convergence of edges during an OPC process. In this situation, one of the edges in a design has failed to completely realize the objective function of the OPC algorithm. Because OPC corrections typically are iterative (i.e., the lithographic process is simulated, an edge is moved, and the lithographic process is simulated again), insufficient iterations can result in non-converged edges. This is most commonly seen either in low-mask error enhancement factor (MEEF) areas, (i.e., areas where edge movements have limited impact on simulated edge placement), or in high-MEEF areas, (i.e., areas where oscillations can typically occur).

Figure 1:
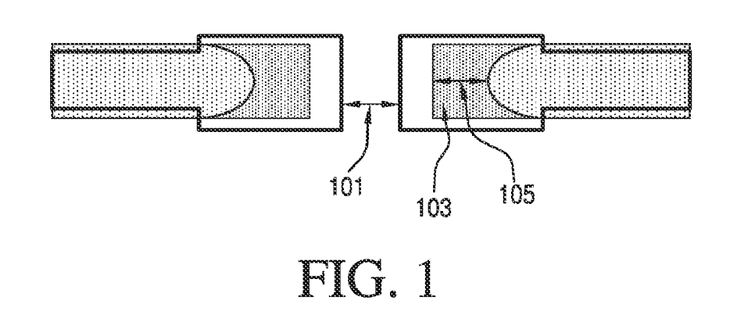
FIG. 1 illustrates an example of an MRC limit causing a printing error.

Another cause of potential print errors is mask rule constraint (MRC) limited edge movement. OPC recipes typically utilize user-defined controls to limit unmanageable reticle shapes. Such limitations (or other user supplied constraints) can prevent needed corrections from being made during an OPC process. FIG. 1 illustrates an example of an MRC limit inducing a printing problem. In FIG. 1, the minimum allowed mask space limit 101 prevents the OPC program from moving the line-end 103, and preventing the excessive pullback printing error 105.

Figure 2:
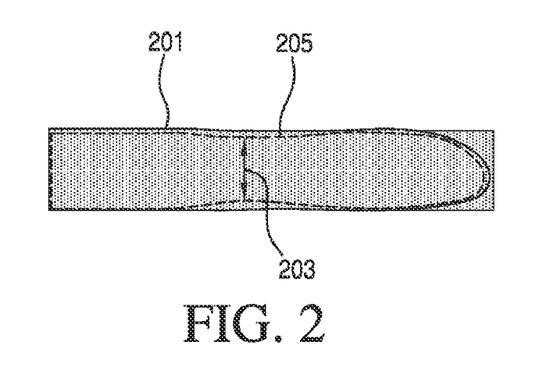
FIG. 2 illustrates an example of a soft pinching failure at defocus.
Figure 3:
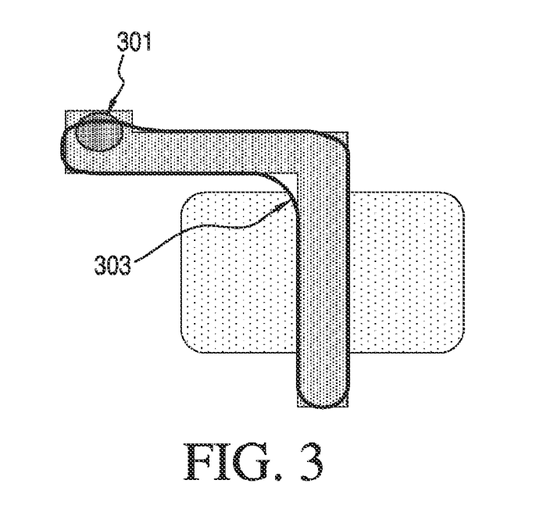
FIG. 3 illustrates an example of two design intent failures.

Having edge fragments in a sub-optimal location can also cause a potential print error. As mentioned previously, design edges are subdivided into smaller edges known as fragments. These fragments are moved to achieve the desired OPC objective function. However, if the fragment locations are not ideal for realizing the objective, a failure can result. Yet another cause of potential print errors is process corner failure. If the final OPC layout data is verified at multiple focus and dose conditions, it is possible to have no defect locations at the nominal conditions, while failures exist at a process corner condition. This is shown graphically in FIG. 2. The nominal focus 201 shows no printing errors. However, a soft-pinching error 203 is manifest at defocus 205, after OPC is complete. Additionally, potential print errors can be caused by what is known as a design-intent failure. This is a condition where a simulated image may show no failure indicating printing errors, and yet the simulated result still fails to satisfy the intent of the designer. FIG. 3 shows two examples of design intent failures. In one case, the polysilicon coverage of the contact is insufficient 301. In the second case the gate length is too large, due to corner rounding 303.

Iterative OPC Repair

The list of failure modes given in the previous section hints at the difficulty of finding a single, globally applicable set of OPC process parameter values, which would correct all potential print failures in every situation. To solve this problem, an iterative repair flow, for correcting potential print failures in layout design data is disclosed.

Figure 4:
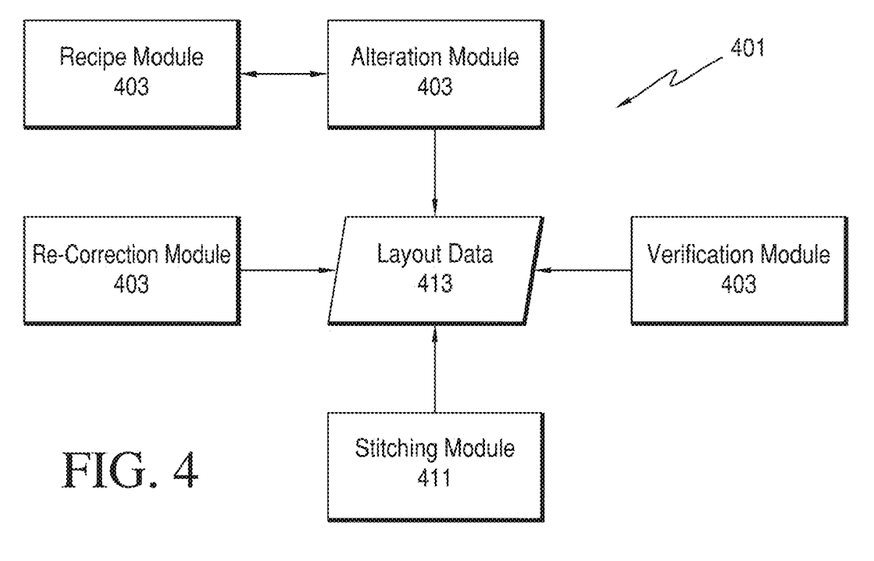
FIG. 4 illustrates an OPC tool according to various implementations of the invention.

FIG. 4 illustrates an example of an OPC repair tool 401 that may be implemented according to various embodiments of the invention. As seen in this figure, the tool 401 includes an alteration module 403, a verification module 405, a re-correction module 407, recipe module 409, and a stitching module 411. An OPC process is applied on layout design data 413 by alteration module 403. Alteration module 403 performs an OPC process on the layout design data 413 using a set of OPC process parameters. The altered data is then checked for errors by the verification module 405. Re-correction module 407 then designates a portion of the layout data around a detected error as a re-correction region. Recipe module 409 creates a second set of parameter values. The alteration module 403 then alters the data designated by the re-correction region using the second set of parameter values.

With various implementations of the invention, the OPC repair tool 401 can be used to correct multiple errors in a layout design. With these implementations, for each error detected by verification module 405, re-correction module 407 creates a separate re-correction region around the detected error. Alteration module 403 then is used to modify the layout data within the designated re-correction regions using a set of parameter values specified by recipe module 409. Alternatively, in still other implementations of the invention, re-correction module 407 creates re-correction regions which include more than one error detected by verification module 405. In still other implementations of the invention, alteration module 403 may use a different set of parameter values specified by recipe module 409 to alter each re-correction region formed by re-correction module 407.

Figure 5:
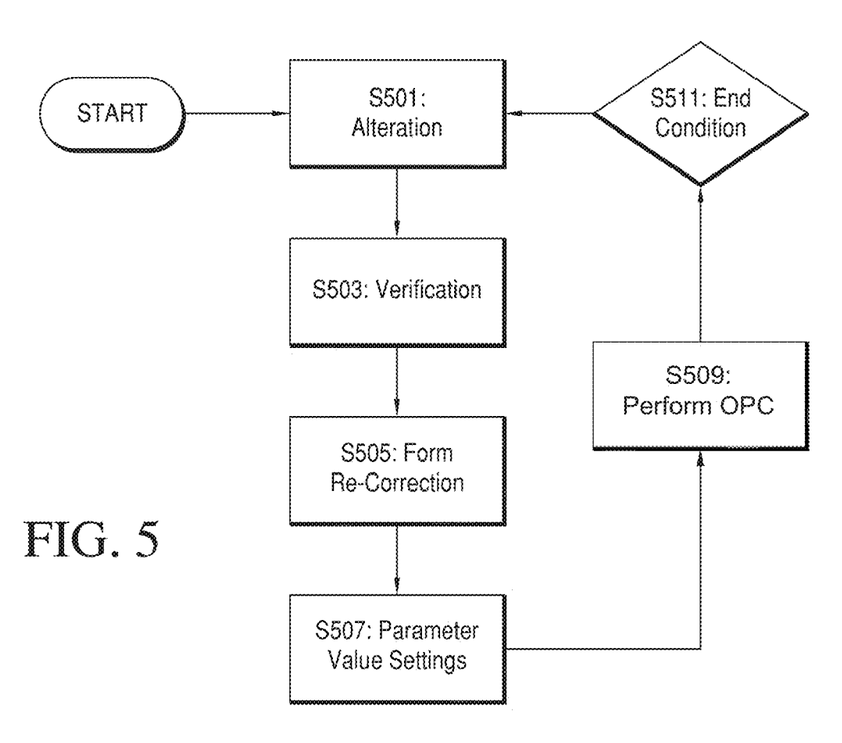
FIG. 5 illustrates a flow chart describing an iterative OPC method according to various implementation of the invention.

The implementation of the embodiment described by FIG. 4 can be performed iteratively using tool 401, as described by the flow chart shown in FIG. 5. As seen in this figure, in step 501 the alteration module 403 alters the layout design data by performing an OPC process on the layout design data 413 using a first set of parameter values. The altered data is then checked for errors by the verification module 405 in S503. In S505, the re-correction module 407 forms a re-correction region around a detected error. Then, in S507, a second set of parameter values are created by recipe module 409. This second set of parameter values is used by the alteration module 403 to perform an OPC process on the portion of the layout design data 413 designated by the re-correction region in S509. Steps 503 through 509 can be repeated until an end condition is satisfied, as described by S511.

The end condition described by S511 can be that a set number of iterations have been performed, that no errors were detected by the verification module 403, that a specified amount of time has been exceeded, or that a specified number of changes have been made to the layout design data, or any another desired end condition.

With various implementations of the invention, different iterations of the OPC process will employ different sets of process parameter values. For example, in step S501 the alteration module 403 performs a first OPC process using a first set of parameter values, and in step S509 the alteration module 403 performs a second OPC process using a second set of parameter values. In various implementations of the invention, the second set of parameter values is created by changing the value of parameter from value the value included in the first set of parameter values. With still other implementations of the invention, the second set of parameter values is created by using at least one different parameter from those used within the first set of parameter values.

In still other examples of the invention, the alteration module 403 may perform use the same OPC process technique for the initial OPC process and subsequent OPC processes. With still other implementations of the invention, however, the alteration module 403 may use different OPC process techniques for the initial OPC process and one or more of the subsequent OPC processes, and/or employ different OPC process techniques for subsequent OPC processes. For example, the alteration module 403 may employ an OPC process technique based upon one type of OPC algorithm for the initial OPC process, and use another OPC process technique based upon a second, different type of OPC algorithm for the subsequent OPC processes.

Figure 6:
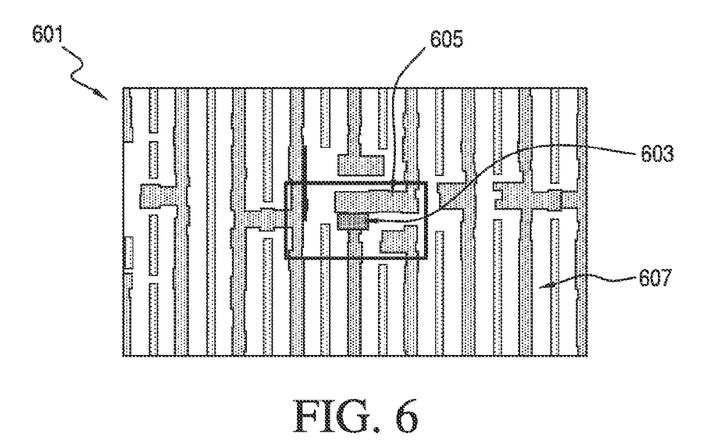
FIG. 6 illustrates an example of layout design data.

In still another implementations of the invention, the re-correction module 407, forms a context region in addition to the re-correction region. More particularly, as shown in FIG. 6, the context region designates a second portion of the layout design data encompassing a corresponding re-correction region as a context region. as seen in this figure, the layout data 601 includes an error 603. As also seen in this figure, a re-correction region 605 has been formed around error 603 by the re-correction module 407, and a context region 607 has also been formed around the re-correction region 605 by the re-correction module 407. With various embodiments of the invention, the alteration process performed in S509, while only altering data designated by the re-correction region 605, is performed based upon the data designated by context region 607. That is, the OPC process is performed on edge fragments within the re-correction region 605 taking into account the position of and corresponding constraints imposed by edge fragments outside of the re-correction regions but within the surrounding context region 607. Those of skill in the art will appreciate that although in this implementation, re-correction module 407 is forming both re-correction region 605 and context region 607, this task could also be performed by separate modules.

With various examples of the invention, a re-correction region 605 is formed by overlaying a specified geometric shape over an error detected by verification module 405. The perimeter of the specified geometric shape then defines the boundary for the re-correction region. Similarly, a context region 607 may be formed by overlaying a larger specified geometric shape over an error detected by verification module 405, or over a previously-formed re-correction region 605. The perimeter of the specified geometric shape then defines the boundary for the context region. With various examples of the invention, the geometric shape used for defining the context regions may be the same as the geometric shape used for defining the re-correction regions, only larger. For example, a square shape may be used to define both the re-correction regions and the context regions. For still other examples of the invention, however, the geometric shape used for defining the context regions may be different from the geometric shape used for defining the re-correction regions.

With still other implementations of the invention, the re-correction region 605 and the context regions 607 may be formed by creating the boundaries a specified distance from the fragments contributing to the error. It also should be noted that, with various examples of the invention, the size of the re-correction region 605 formed around a detected error, the size of the context region 607 formed around a detected error, or both may increase or decrease with each subsequent iteration of the OPC process using a different set of parameter values.

Additionally, various implementations of the invention may restrict the edge fragments that can be moved by an OPC process to only those fragments located entirely within the re-correction region 605. In other implementations, however, the OPC process may be permitted to move those fragments which extend into or touch the re-correction region 605 boundary in addition to the fragments entirely enclosed by the re-correction region 605. Similarly, with various examples of the invention, the OPC process may take into account only those edge fragments located entirely within the context region 607. In still other implementations, however, the OPC process may account for those fragments which extend into or touch the boundary of the context region 607.

As will be appreciated by those of ordinary skill in the art, a number of different process parameters can be employed in an OPC process, and the choice of these parameters, as well as the value associated with each parameter, can vary. The following is provided as an example of some of the process parameters typically employed by those of ordinary skill in the art: fragment size, location, and spacing constraints; feedback factors, which, when applied, act as dampening factors within the alteration process carried out by alteration module 403; weighting factors for one or more of the other process parameters; and the number of simulation iterations performed by the OPC process. These are just a few examples of known OPC process parameters, but still other parameters are known to those of ordinary skill in the art and can be employed with various embodiments of the invention. The parameters and parameter values created by recipe module 409 can vary according to any known criteria, including, for example, user defined preferences, design constraints, photolithography or fabrication tool constraints, and/or prior learning or knowledge about the OPC process and design layout.

Stitching Re-Correction Regions into the Layout

Figure 7:
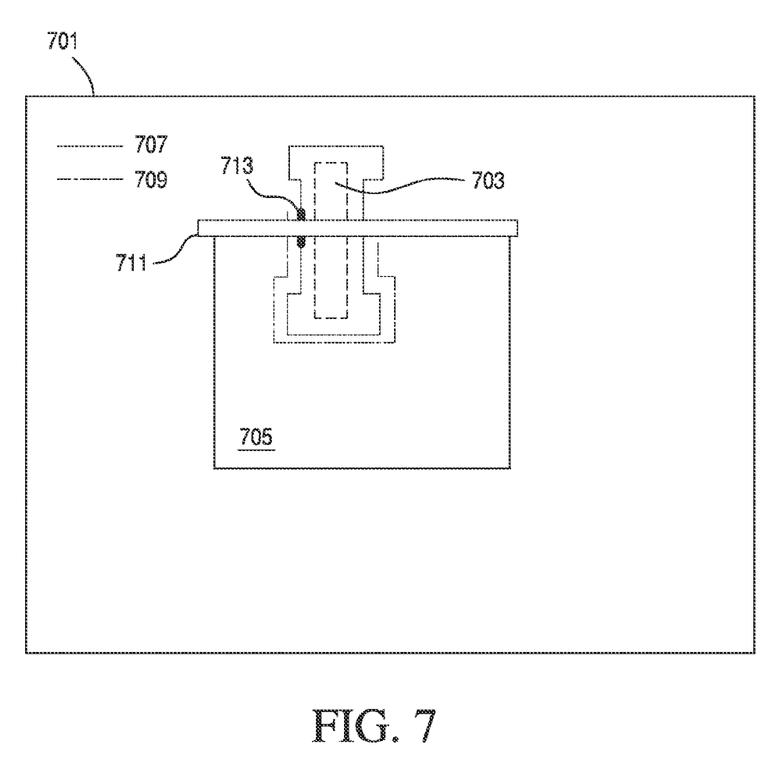
FIG. 7 illustrates an example of layout design data.

Once the repair flow has completed (e.g., no errors are detected by verification module 405 or the end condition has been otherwise satisfied in step S511), the layout design data may contain sections that have been modified by multiple OPC processes, as shown in FIG. 7. As seen in this figure, the layout data 701 includes polygon edges 707 and polygon edges 709 that were created during OPC processes from an initial polygon shape 703. As discussed in detail above, however, the polygon edges 709 are arranged by an OPC process that is subsequent to the OPC process in which the edges 707 are arranged. Accordingly, the polygon edges 707 may not be aligned with the polygon edges 709 at the boundary of the re-correction region 705. This has the potential to causes a "jog" problem at the boundary, which could cause an additional print error.

To address this potential discrepancy, with various implementations of the invention the OPC tool 401 may also include a stitching module 411. The stitching module 411 "stitches" the layout design data modified by a subsequent OPC process into an earlier version of the layout design data so that the edge fragments at the boundary line up sufficiently to prevent additional potential print errors.

More particularly, stitching module 411 matches an edge fragment at one side of the boundary of the re-correction region with the corresponding fragment on the opposite side of the boundary of the re-correction region, and then moves the fragments into alignment. With various examples of the invention, the stitching module 411 forms a stitching band 711 around the subsequent OPC 709 layout data as shown in FIG. 7. The stitching band 711 is sufficiently broad to overlap both the edge fragments 709 proximal to one side of the re-correction region boundary and edge fragment 707 proximal to the opposite side of the re-correction region boundary. A typical stitching band may be, for example, 100 nm in width, but can varied as necessary to ensure alignment between edge fragments on either side of the re-correction region boundary. For a target fragment falling within the stitching band 711 (e.g., edge fragment 713), all fragments within a specified distance from the target fragment are identified, and an identified fragment with the same orientation as the target fragment is selected. (Typically, conventional design constraints will prevent more than one fragment from being selected for alignment with the target fragment.) These fragments are then aligned by stitching module 411 to remove the potential print errors created by a "jog" at the boundary.

Simulated Examples and Results

The following experiment was conducted using an OPC technique according to various implementations of the invention. The following conditions were used: layout type was at the 45 nm node metal 1 layer; layout size was a 100 um×100 um window; model based OPC was applied with Calibre® nmOPC; model based OPC verification was applied with Calibre® OPCverify; and an iterative OPC repair flow was implemented with Calibre®.

Figure 8:
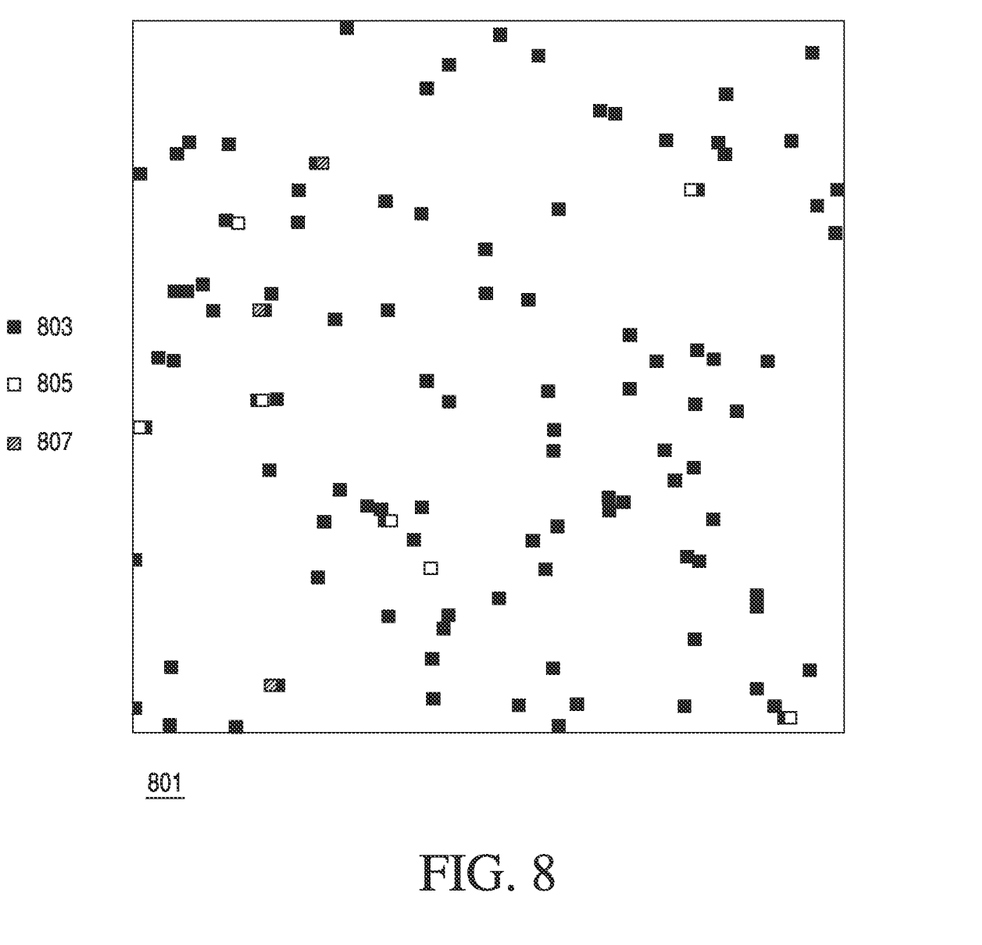
FIG. 8 illustrates an example of layout design data.

In this experiment, various tools from the Calibre® product (available from Mentor Graphics Corporation of Wilsonville, Oreg.) were used. The image in FIG. 8 shows a 100 um square layout 801 at low magnification, along with the error markers identified at each iteration of the repair flow. The error markers 803 mark errors identified before an initial OPC process, while error markers 805 mark errors identified after an performing an initial OPC process but before a first iteration of the repair flow, and error markers 807 mark errors identified after the first iteration of the repair flow. No errors were detected after a second iteration of the repair flow. In the experiment, the process parameter values adjusted at each iteration were the fragmentation of the edges and the number of simulation iterations.

Table 1 plots the number of potential print errors found and corrected at each iteration of the repair flow. As can be seen, the number of potential print errors before performing an initial OPC process was 123. The number of defects decreased with each iteration of the repair flow. After 2 iterations of the repair flow, the number of defects had been reduced to zero, and the final mask data could then be written out and the mask created.

Table 2 plots the number of edges processed at each step within the flow, normalized to the initial edge count, and multiplied by 100. This plot shows that the number of re-processed edges is quite small. Additionally, the number of edges that were processed, which has an impact on run time, was also reduced with each iteration.

Figure 9A:
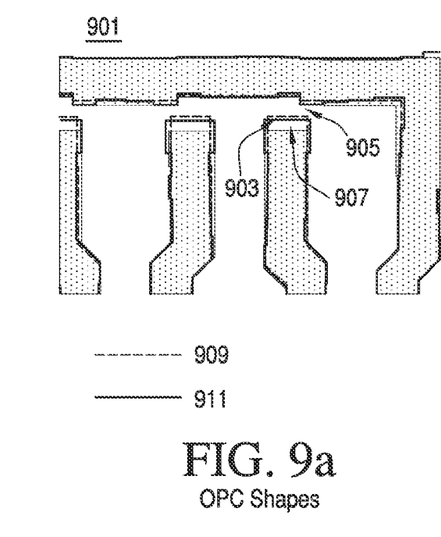
FIGS. 9a and 9b illustrate an excessive line-end pullback defect repaired.
Figure 9B:
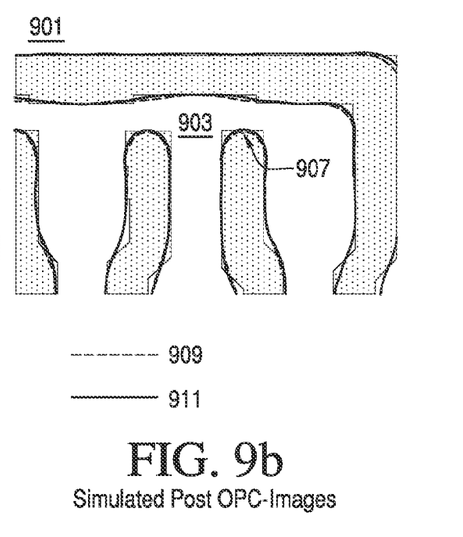

FIGS. 9a and 9b illustrate an example of repairing an layout design upon which an initial OPC process has been performed. Sample OPC layout shapes 901 are shown. An excessive line-end pullback defect 903 is repaired. OPC layout shapes 901 contain an MRC limited movement constraint 905, which causes the line-end pullback 903. The 10 nm line-end pullback 903 is reduced to 0 nm, 907, after a secondary OPC procedure. The original OPC 909 containing the error 903 is shown, as well as the repaired OPC 911, which contains the repair 907. FIG. 9a is a representation of the OPC shapes, while FIG. 9b is a representation of the simulated OPC image contours.

Figure 10A:
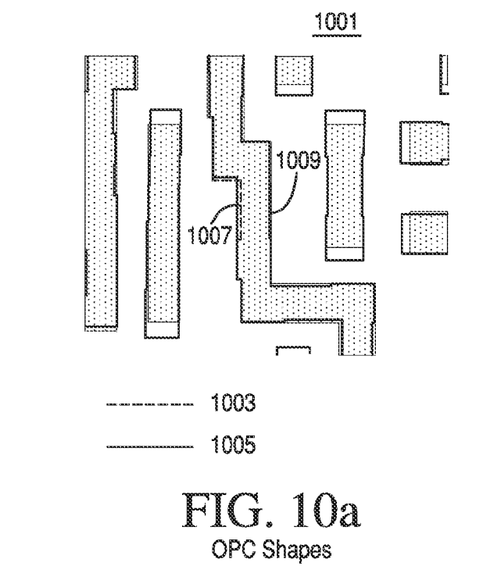
FIGS. 10a and 10b illustrate a soft pinching defect repaired.
Figure 10B:
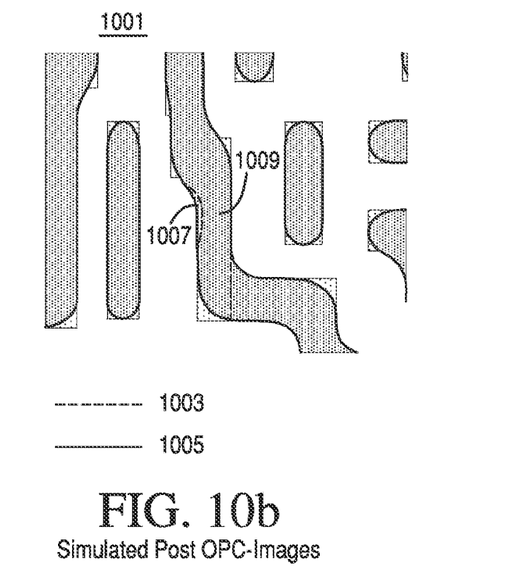

Additionally, FIGS. 10a and 10b illustrate another example of a repaired OPC layout. Layout data 1001, which contains OPC shapes represented in FIG. 10a and simulated post-OPC images in FIG. 10b, is shown. Original OPC 1003 as well as repaired OPC 1005 are also represented. A soft-pinching error 1007 is illustrated, which is repaired 1009 after secondary OPC Also FIG. 10b depicts joining OPC data from different processes together with a seamless stitch 1011.

CONCLUSION

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

Additionally, although the illustrative embodiments are shown utilizing an OPC process as the resolution enhancement technique, the selective approach to layout data repair and the disclosed repair flow can be applied to other layout data modification processes used to implement resolution enhancement techniques, including layout data modification processes using to implement phase control, direction control and immersion.

What is claimed is:

1. A computer-implemented method of modifying integrated circuit layout design data, comprising:
    A. identifying a layout design, the layout design representing at least a portion of an integrated circuit design;
    B. implementing a resolution enhancement process having a first set of parameter values on the layout design, wherein an altered layout design is generated;
    C. checking for errors within the altered layout design, wherein one or more errors is detected;
    D. forming a re-correction region around at least one of the one or more detected errors, wherein the re-correction region designates a sub-portion of the altered layout design;
    E. identifying a second set of parameter values, wherein the second set of parameter values is different than the first set of parameter values;
    F. implementing an optical proximity correction process having the second set of parameter values on the sub-portion of the altered layout design designated by the re-correction region, wherein an altered sub-portion of the layout design is generated;
    G. stitching the altered sub-portion of the layout design into the altered layout design, wherein a modified layout design is generated; and
    H. saving the modified layout design to a memory storage location.

2. The computer-implemented method recited in claim 1, further comprising iterating method acts C through F until an end condition is met, wherein a plurality of altered sub-portions of the layout design are generated, and wherein method act G stitches the plurality of altered sub-portions of the layout design into the altered layout design.

3. The computer-implemented method recited in claim 2, wherein the end condition is that a specified number of iterations have been performed.

4. The computer-implemented method recited in claim 2, wherein the end condition is that no errors were detected by method act C.

5. The computer-implemented method recited in claim 1, wherein the second set of parameter values has at least one different parameter than does the first set of parameter values.

6. The computer-implemented method recited in claim 1, wherein a one of the parameters of the first set of parameter values is selected from the group consisting of: polygon edge fragment location within the layout design, polygon placement within the layout design; a feedback factor, a weighting factor given to each resolution enhancement process condition, and the number of times the resolution enhancement process is simulated during each iteration.

7. The computer-implemented method recited in claim 1, wherein method act D further comprises:
    forming a context region, the context region encompassing the re-correction region and designating a second sub-portion of the layout design;
    the optical proximity correction process implemented by method act F takes as input the second sub-portion of the layout design designated by the context region; and
    the optical proximity correction process implemented by method act F only alters the sub-portion of the layout design designated by the re-correction region.

8. The computer-implemented method recited in claim 1, further comprising iterating the method acts C through G until an end condition is met.

9. The computer-implemented method recited in claim 1, wherein a one of the parameters of the second set of parameter values is selected from the group consisting of: polygon edge fragment location within the layout design, polygon placement within the layout design; a feedback factor, a weighting factor given to each resolution enhancement process condition, and the number of times the resolution enhancement process is simulated during each iteration.

10. One or more computer-readable media, having computer executable instructions for modifying integrated circuit layout design data stored thereon, the computer executable instructions comprising:
  causing a computer to perform a set of operations; and
  wherein the set of operations include:
  A. identifying a layout design, the layout design representing at least a portion of an integrated circuit design;
  B. implementing a resolution enhancement process having a first set of parameter values on the layout design, wherein an altered layout design is generated;
  C. checking for errors within the altered layout design, wherein one or more errors is detected;
  D. forming a re-correction region around at least one of the one or more detected errors, wherein the re-correction region designates a sub-portion of the altered layout design;
  E. identifying a second set of parameter values, wherein the second set of parameter values is different than the first set of parameter values;
  F. implementing an optical proximity correction process having the second set of parameter values on the sub-portion of the altered layout design designated by the re-correction region, wherein an altered sub-portion of the layout design is generated;
  G. stitching the altered sub-portion of the layout design into the altered layout design, wherein a modified layout design is generated; and
  H. saving the modified layout design to a memory storage location.

11. The one or more computer-readable media recited in claim 10, the set of operations further comprising iterating the operations C through F until an end condition is met, wherein a plurality of altered sub-portions of the layout design are generated, and wherein operations G stitches the plurality of altered sun-portions of the layout design into the altered layout design.

12. The one or more computer-readable media recited in claim 11, wherein the end condition is that a specified number of iterations have been performed.

13. The one or more computer-readable media recited in claim 11, wherein the end condition is that no errors were detected by method act C.

14. The one or more computer-readable media recited in claim 10, wherein the second set of parameter values has at least one different parameter than does the first set of parameter values.

15. The one or more computer-readable media recited in claim 10, wherein a one of the parameters of the first set of parameter values is selected from the group consisting of: polygon edge fragment location within the layout design, polygon placement within the layout design; a feedback factor, a weighting factor given to each resolution enhancement process condition, and the number of times the resolution enhancement process is simulated during each iteration.

16. The one or more computer-readable media recited in claim 10, wherein: operation D further comprises forming a context region, the context region encompassing the re-correction region and designating a second sub-portion of the layout design;
  the optical proximity correction process implemented by operation F takes as input the second sub-portion of the layout design designated by the context region; and
  the optical proximity correction process implemented by operation F only alters the sub-portion of the layout design designated by the re-correction region.

17. The one or more tangible computer-readable media recited in claim 10, further comprising iterating the operations C through G until an end condition is met.

18. The one or more computer-readable media recited in claim 10, wherein a one of the parameters of the second set of parameter values is selected from the group consisting of: a polygon edge fragment location within the layout design, a polygon placement within the layout design; a feedback factor, a weighting factor given to each parameter, and the number of times the optical proximity correction process is simulated during each iteration.

19. An apparatus for modifying an integrated circuit design comprising:
  a recipe module configured to generate parameters to be used in a resolution enhancement process;
  a first alteration module configured to generate an altered layout design by implementing a resolution enhancement process using a first set of parameter values generated by the recipe module on a layout design representing at least a portion of an integrated circuit design;
  a verification module configured to check for errors within the altered layout design;
  a re-correction module configured to generate a re-correction region designating a sub-portion of the altered layout design by forming a re-correction region around at least one error detected by the verification module;
  a second alteration module configured to generate an altered sub-portion of the layout design by implementing an optical proximity correction process using a second set of parameter values generated by the recipe module on a sub-portion of the altered layout design designated by a re-correction region generated by the re-correction module, wherein the second set of parameter values is different than the first set of parameter values; and
  a stitching module configured to generate a modified layout design by stitching the altered sub-portion into the altered layout design.

20. The apparatus of claim 19, wherein the first alteration module and the second alteration module are the same module.

* * * * *